United States Patent
Clemens et al.

(10) Patent No.: US 9,873,938 B2
(45) Date of Patent: Jan. 23, 2018

(54) DEPOSITING CALCIUM FLUORIDE TEMPLATE LAYERS FOR SOLAR CELLS

(71) Applicant: The Board of Trustees of the Leland Stanford Junior University, Palo Alto, CA (US)

(72) Inventors: Bruce M. Clemens, Stanford, CA (US); James R. Groves, Sunnyvale, CA (US); Garrett J. Hayes, Livermore, CA (US); Bingrui Joel Li, Stanford, CA (US); Alberto Salleo, San Francisco, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 539 days.

(21) Appl. No.: 14/570,303

(22) Filed: Dec. 15, 2014

(65) Prior Publication Data
US 2015/0197844 A1 Jul. 16, 2015

Related U.S. Application Data (63) Continuation of application No. 13/442,658, filed on Apr. 9, 2012, now abandoned.
(Continued)

(51) Int. Cl.
*C23C 14/22* (2006.01)
*C23C 14/06* (2006.01)
(Continued)

(52) U.S. Cl.
CPC .......... *C23C 14/0694* (2013.01); *B32B 7/02* (2013.01); *C23C 14/221* (2013.01); *C30B 25/06* (2013.01);
(Continued)

(58) Field of Classification Search
CPC .......... B32B 2307/704; C23C 14/0694; C23C 14/221; C30B 25/06
See application file for complete search history.

(56) References Cited

U.S. PATENT DOCUMENTS

| | | | |
|---|---|---|---|
| 5,356,831 A * | 10/1994 | Calviello | H01L 21/84 117/105 |
| 2001/0002074 A1 * | 5/2001 | Kato | B29D 11/00009 351/159.73 |
| 2010/0276601 A1 * | 11/2010 | Duraj | G01T 1/202 250/362 |

OTHER PUBLICATIONS

Gaire et al, "Small angle grain boundary Ge films on biaxial Caf2/glass substrate", Journal of crystal growth 312 (2010) p. 607-610.*

(Continued)

*Primary Examiner* — Matthew Song
(74) *Attorney, Agent, or Firm* — Lumen Patent Firm (57) ABSTRACT

A biaxially textured crystalline layer formed on a substrate using ion beam assisted deposition (IBAD) is provided. The biaxially textured crystalline layer includes an oriented $CaF_2$ crystalline layer having crystalline grains oriented in both in-plane and out-of-plane directions, where the out-of-plane orientation is a (111) out-of-plane orientation. The oriented $CaF_2$ crystalline layer is disposed for growth of a subsequent epitaxial layer and the $CaF_2$ crystalline layer is an IBAD $CaF_2$ layer. The biaxially textured $CaF_2$ layer can be used in a photovoltaic cell, an electronic or optoelectronic device, an integrated circuit, an optical sensor, or a magnetic device.

9 Claims, 11 Drawing Sheets

Related U.S. Application Data

(60) Provisional application No. 61/516,834, filed on Apr. 8, 2011.

(51) Int. Cl.
 *C30B 25/06* (2006.01)
 *B32B 7/02* (2006.01)

(52) U.S. Cl.
 CPC ..... *B32B 2307/704* (2013.01); *B32B 2457/00* (2013.01); *Y10T 428/24355* (2015.01)

(56) References Cited

OTHER PUBLICATIONS

Li et al, "Biaxially orientated CaF2 films on amorphous substrates", Journal of crystal growth 310 (2008) p. 3610-3614.*

* cited by examiner

DEPOSITING CALCIUM FLUORIDE TEMPLATE LAYERS FOR SOLAR CELLS

CROSS-REFERENCE TO RELATED APPLICATIONS

This application is a continuation of U.S. patent application Ser. No. 13/442,658 filed Apr. 9, 2012, now abandoned, which is incorporated herein by reference. U.S. patent application Ser. No. 13/442,648 claims priority from U.S. Provisional Patent Application 61/516,834 filed Apr. 8, 2011, which is incorporated herein by reference.

FIELD OF THE INVENTION

The present invention relates generally to biaxially oriented, polycrystalline thin films. More particularly, the invention relates to a method for forming biaxially oriented $CaF_2$ with a (111) biaxial texture for crystallographically oriented silicon solar cells.

BACKGROUND OF THE INVENTION

Solar cell efficiency is a strong function of minority carrier lifetime, since photo-generated carriers that recombine before reaching the p-n junction do not contribute to photocurrent. Grain boundaries in polycrystalline silicon films provide electron traps that act as recombination centers that reduce minority carrier lifetimes. This recombination is a function of the grain boundary structure. In particular, the high dislocation density of high-angle grain boundaries result in a higher recombination rate than low angle grain boundaries. It is known that the effective carrier lifetime increases as the dislocation density decreases, and it has been shown that recombination is a strong function of grain boundary defect density.

Grain boundaries can be described as having both out-of-plane and in-plane misorientation known as tilt and twist, respectively. Both types of misorientation result in defect densities that lead to recombination. The degree of tilt and twist in a thin film grain boundary population reflects the crystallographic texture of the film. Biaxial texture, which has a preferred crystallographic direction for both out-of-plane and in-plane directions, can decrease both twist and tilt misorientation between grains. One way to develop biaxial texture is by application of an ion beam during the initial stages of nucleation of a thin film. This ion beam assisted deposition (IBAD) process uses a low energy (<1 keV), typically inert ($Ar^+$) ion beam to develop in-plane texture in a growing thin film during concurrent physical vapor deposition of the desired source material. The ion beam is aligned along a particular crystallographic direction at an oblique angle relative to the desired out-of-plane growth direction. The ion beam sputters away unfavorably orientated crystallites and allows favorably orientated crystallites to survive and grow. If the correct channeling angle is selected then biaxial texture can develop.

The IBAD process has been used to form MgO template layers for seeding crystallographic texture in the high temperature superconductor $YBa_2Cu_3O_7$, (YBCO), as its superconducting properties are dependent upon the amount of in-plane alignment. Typically, IBAD MgO can be deposited with an in-plane texture of 5-6° phi-scan FWHM and out-of-plane omega-scan FWHM of about 1°, which is very near single crystal quality.

An IBAD MgO template layer has been used, optimized for high-temperature superconductor coated conductors, as a template layer for the deposition of polycrystalline silicon. Silicon films deposited on this template layer have reduced grain boundary misorientation and increased carrier mobility. It has been shown that germanium films deposited on the MgO template layer with a $CeO_2$ buffer layer exhibits strong biaxial texture.

Crystal silicon (c-Si) is a nearly ideal photovoltaic (PV) material: it can be highly efficient, is naturally abundant and is environmentally benign. However, silicon wafer fabrication is expensive and energy intensive, limiting potential silicon PV cost reductions. This has motivated research into 'film crystal silicon' PV, where c-Si is deposited directly from $SiH_4$ onto an inexpensive substrate, thereby bypassing costly wafer fabrication steps. Such inexpensive substrates (e.g. display glass) are generally amorphous or polycrystalline and cannot sustain high temperatures for long periods; therefore, it is difficult to grow high quality c-Si on them. The key to film c-Si PV is achieving an adequate minority carrier diffusion length ($L_D$), despite the temperature limitation. Specifically, $L_D$ must exceed three times the film thickness. Most proposed routes to film c-Si on glass result in polycrystalline films; for example, the c-Si formed by annealing amorphous silicon (a-Si) yields micron-size, randomly-oriented grains. The grain boundaries (GBs) in crystallized a-Si films have high recombination activity, reducing both $L_D$ and the solar cell open circuit voltage ($V_{OC}$). Furthermore, grain boundaries parallel to the surface may impede hydrogen diffusion into the film, reducing the efficacy of post-growth hydrogenation treatments. Thus, the requirement for $L_D$ will likely require films with large columnar grains to reduce the number of GBs or well-oriented columnar grains with low-angle GBs that may be less recombination active.

To improve the crystalline order in the deposited c-Si film, researchers are investigating various 'seed and epitaxy' techniques. In these approaches, a seed layer with desirable grain structure is fabricated first and then the active silicon layer is grown epitaxially on that seed. For example, solar cells were demonstrated using large grained silicon seed layers formed by aluminum-induced crystallization of amorphous silicon. There has also been progress using cube-textured foil substrates as the seed, where biaxially textured Ge layers were fabricated and a proof-of-concept 1% efficient biaxially textured Si solar cell has been reported.

Although solar cells made from silicon wafers dominate the existing photovoltaic (PV) market, the wafer fabrication process is energy-intensive and expensive, comprising about half of the typical module price. Despite their high cost, silicon wafers are employed because they have excellent crystal quality and few impurities.

What is needed is a method and device with PV-quality film of crystal silicon (c-Si) on a low-cost substrate, where such "film crystal silicon" can retain the proven qualities of crystal silicon PV such as high solar conversion efficiency, safe and abundant raw materials, and high-yield manufacturing, but at a much lower cost.

SUMMARY OF THE INVENTION

To address the needs in the art, a method of forming a biaxially textured crystalline layer is provided that includes depositing an oriented $CaF_2$ crystalline layer, using ion beam assisted deposition (IBAD), on a substrate, where the oriented $CaF_2$ crystalline layer comprises a (111) out-of-plane orientation.

According to one aspect of the invention, the oriented $CaF_2$ crystalline layer is disposed for growth of a subsequent epitaxial layer. In a further aspect, the subsequent epitaxial layer can include $CaF_2$, $BaF_2$, $CdF_2$, $SrF_2$, Si, Ge, YSZ, $Al_2O_3$, Cu, Au, Ag, Pt, Ir, GaAs, GaP, AlAs, ZnSe, CdS, InP, InAs, InGaAs AlGaAs, GaSb, CdSe, AlSb, ZnTe, or InGaAs.

In another aspect of the invention, the substrate can include glass, metal, ceramic, polymer, Si, Ge, YSZ, $Al_2O_3$, Cu, Au, Ag, Pt, Ir, GaAs, GaP, AlAs, ZnSe, CdS, InAs, InGaAs AlGaAs, GaSb, CdSe, AlSb, ZnTe, InGaAs, InP, fused quartz, $SiO_2$, SiN, glass, plastics, or metal foils.

In a further aspect of the invention, the oriented $CaF_2$ crystalline layer contains added materials to form an alloyed $CaF_2$ crystalline layer. In one aspect, the added materials can include $BaF_2$, $SrF_2$, or $CdF_2$. In another aspect, the alloyed $CaF_2$ crystalline layer includes a lattice constant in the range between 5.39 Angstroms and 6.2 Angstroms. In yet another aspect, the alloyed $CaF_2$ crystalline layer has a composition that is up to 99.999% alloying material.

According to one aspect of the invention, the oriented $CaF_2$ crystalline layer is doped with Europium.

BRIEF DESCRIPTION OF THE DRAWINGS

FIGS. 1A-1E show in situ RHEED analysis of the evolution of the surface texture during growth of the $CaF_2$ and Ge layers.

DETAILED DESCRIPTION

Ion beam assisted deposition is a proven technology for growing thin films with biaxial texture, similar to single crystals. In one embodiment, the invention provides a PV device and a method to control the grain boundary alignment in a polycrystalline thin film of silicon. This is achieved by depositing a biaxially aligned layer of calcium fluoride ($CaF_2$) or yttrium oxide-stabilized zirconium oxide (YSZ) that can be used as a template layer for the subsequent deposition of epitaxial layers. The biaxial alignment of the template layer is achieved by using the ion beam assisted deposition process (IBAD). The IBAD template layer can then be used as a platform for subsequent deposition of heteroepitaxial silicon or other materials. This invention enables the deposition of polycrystalline silicon on technical substrates of large areas or long lengths. The invention may be used to deposit polycrystalline silicon on large areas for photovoltaic applications. The technology can be applied to the semiconductor industry where oriented polycrystalline silicon provides an advantage to microelectronic performance.

According to one aspect, the invention enables polycrystalline thin films of silicon to be deposited with low-angle grain boundaries, thereby reducing the dislocation density and increasing the effective carrier lifetime. Because IBAD is a low temperature process, typically conducted at room temperature, it is amenable to technically important substrates. The substrate can include glass, metal, ceramic, polymer, Si, Ge, YSZ, $Al_2O_3$, Cu, Au, Ag, Pt, Ir, GaAs, GaP, AlAs, ZnSe, CdS, InAs, InGaAs AlGaAs, GaSb, CdSe, AlSb, ZnTe, InGaAs, InP, fused quartz, $SiO_2$, SiN, glass, plastics, or metal foils.

The IBAD process is amenable to process scaling, according to one aspect of the invention. By scaling the process to correct proportions, it is possible to coat large area and long length substrates. The invention includes a template to provide a highly oriented, textured polycrystalline silicon film to virtually any substrate.

According to one embodiment, the invention provides a method to control the grain boundary alignment in polycrystalline thin films of silicon by using a biaxially textured template layer of $CaF_2$ for photovoltaic device applications. Here, $CaF_2$ is chosen as a candidate material due to its close lattice match with silicon and its suitability as an IBAD material. The $CaF_2$ aligns biaxially at a thickness of ~10 nm and, with the addition of an epitaxial $CaF_2$ layer, has an in-plane texture of ~15°. Deposition of a subsequent layer of Si aligns to the template layer with an in-plane texture of 10.8°. The additional improvement of in-plane texture is similar to the behavior observed in more fully characterized IBAD materials systems. In one embodiment, a germanium buffer layer is used to assist the epitaxial deposition of Si on $CaF_2$ template layers and single crystal substrates, where the IBAD template is used to biaxially orient polycrystalline Si.

Here, the IBAD process is used to develop a template layer for the subsequent deposition of polycrystalline silicon for photovoltaic applications. According to the invention, $CaF_2$ is chosen as a starting template material because it fulfills some of the empirically accepted criteria for a good IBAD candidate material. $CaF_2$ is a cubic material with well-defined channeling planes, is highly ionic in bond character, and $CaF_2$ is lattice matched to Si with lattice parameters of 0.5451 nm and 0.5431 nm, respectively. In one example the IBAD $CaF_2$ as template layer for the subsequent deposition of heteroepitaxial polycrystalline silicon with low angle grain boundaries associated with biaxial crystallographic texture is described. According to a further embodiment of the invention, the subsequent epitaxial layer can include $CaF_2$, $BaF_2$, $CdF_2$, $SrF_2$, Si, Ge, YSZ, $Al_2O_3$, Cu, Au, Ag, Pt, Ir, GaAs, GaP, AlAs, ZnSe, CdS, InP, InAs, InGaAs AlGaAs, GaSb, CdSe, AlSb, ZnTe, or InGaAs.

According to one embodiment, the invention includes a substrate, the IBAD template layer and the heteroepitaxially deposited silicon layer. An intermediate layer may be used to assist the improvement of texture for the final silicon film. The invention includes the use of the IBAD process that provides the concurrent Ar ion and $CaF_2$ fluxes. The ion energy range for this invention can be varied between 200 and 900 eV with a current density of ~80 $\mu A/cm^2$. The electron beam evaporator provided the $CaF_2$ vapor flux at 0.06 nm/s to 0.11 nm/s. The flow rate or Ar gas into the system was kept constant at 10 sccm, which corresponded to a chamber pressure of ~$5.0 \times 10^{-3}$ Pa. Subsequent Ge and Si films were deposited in-situ using e-beam evaporation at 570° C. and 0.05 nm/s. In some examples, the Ge and Si layers were sputter deposited at temperatures between 500° C. and 800° C.

Biaxially textured $CaF_2$ is not found in nature and it is impossible for biaxially textured $CaF_2$ to form naturally, where it can only be made in a laboratory under highly unnatural processing conditions through careful and deliberate manipulation. It has a highly unnatural physical structure (arrangement of atoms and grains), vastly different than the geologic mineral $CaF_2$, and as a result of it's highly unnatural structure has unnatural properties. The invention utilizes IBAD and provides the entirely new material, oriented $CaF_2$. Further, the invention uses (111) orientation as a template, where biaxially textured heteroepitaxial crystal silicon (c-Si) films are grown on display glass as, for example, a low-cost photovoltaic material. In one example, textured $CaF_2$ seed layers are fabricated using ion-beam assisted deposition, then coat the $CaF_2$ with a thin, evaporated epitaxial Ge buffer and finally deposit heteroepitaxial silicon on the Ge. The silicon is grown by hot-wire chemical vapor deposition, a high-rate, scalable epitaxy technology. Electron and X-ray diffraction confirm the biaxial texture of the $CaF_2$ and epitaxial growth of the subsequent layers. Transmission electron microscopy reveals columnar silicon grains about 500 nm across. An exemplary epitaxial film c-Si solar cell is provided with an open circuit voltage of 375 mV that is limited by minority carrier lifetime. More specifically, the invention includes fabrication of biaxially textured epitaxial materials and film c-Si solar cells on display glass using $CaF_2$ seeds grown by ion-beam assisted deposition (IBAD) and coated with an intermediate evaporated Ge buffer layer. The intermediate Ge layer is included because Ge is compatible with heteroepitaxial growth of both $CaF_2$ and Si, though direct Si growth on $CaF_2$ may also be possible. The current invention includes an inexpensive display glass substrate that has a close thermal expansion match to c-Si, where all layers are grown using scalable, low-cost technologies and the film c-Si grains are biaxially textured. In biaxially textured films, GBs are low-angle and have fewer dangling bonds, thus reducing GB recombination. Biaxial $CaF_2$ seed layers (a=5.46 Å) has the advantage of being cubic and nearly lattice matched to Si (also cubic, a=5.42 Å) at room temperature.

In one example $CaF_2$ seed layers are deposited at 500° C. by electron beam evaporation of $CaF_2$ onto Corning Eagle 2000 Boro-Aluminosilicate display glass substrates, which have a strain point of 666° C. and a softening point of 985° C. The thermal stability of Eagle 2000 glass (similar to Corning 1737 glass) is much better than soda lime glasses (strain point ~520° C., softening point ~820° C.). $CaF_2$ growth is initiated with a simultaneous Ar ion beam assist using a 800 eV, 80 $\mu A\,cm^{-2}$ Ar ion flux directed at ~55° from the sample surface normal. The ion flux was generated with a Kaufman ion source with an Ar source flow of 10 sccm. After an initial 15-nm thick IBAD film is grown, the ion beam is blocked using a shutter and then deactivated. $CaF_2$ homoepitaxial growth is continued at 500° C. for an additional 170 nm, using a slower evaporation rate. With no ion flux present, the $CaF_2$ deposition rate is 0.05 nm $min^{-1}$; during the initial IBAD growth, the deposition rate is 0.11 nm $min^{-1}$. The system base pressure is $5.0 \times 10^{-8}$ Torr; during IBAD growth, the process pressure is $4 \times 10^{-5}$ Torr. After $CaF_2$ growth, 50 nm of Ge is deposited in the same reactor by electron beam evaporation at 550° C. at 0.03 nm $min^{-1}$. The glass/$CaF_2$/Ge samples are then removed from the evaporator and transferred to a hot-wire chemical vapor deposition (HWCVD) reactor for silicon growth. Silicon layers are grown at a substrate temperature of 700±50° C. using 20 sccm of $SiH_4$ source gas at 10 mTorr decomposed on a 2100±100° C. tungsten filament positioned 5 cm from the substrate. The silicon layers are doped by mixing controlled amounts of $PH_3$ into the source $SiH_4$ gas. The base pressure of the HWCVD reactor is below $10^{-7}$ Torr.

Solar cells (see schematic in FIG. 5A) are completed by hydrogenating the epitaxial silicon films at 610° C. with atomic H generated by an inductively coupled plasma and then growing an amorphous silicon heterojunction emitter and an indium tin oxide transparent conducting layers for the front contact. In one embodiment, individual 0.05 $cm^2$ devices are isolated by masking the samples and using acid and reactive ion etches. A back metal contact is made directly to the exposed n+ silicon layer approximately 3 mm from the edge of the mesa.

Both $CaF_2$ and Ge film growth are monitored in situ using a 28 keV reflection high energy electron diffraction (RHEED) electron beam aligned perpendicular to the ion beam. The crystal structures of the films are determined ex-situ using X-ray diffraction (XRD). Samples are prepared for cross-section transmission electron microscopy (TEM) using a focused ion beam.

Figure 1A:
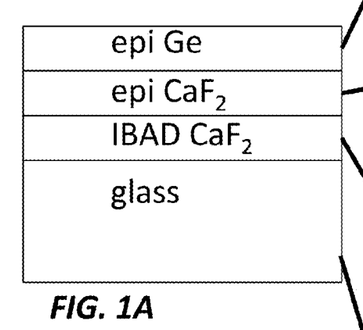
FIG. 1A shows a schematic of a PV structure.
Figure 1B:
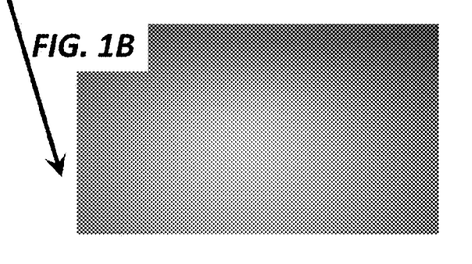
FIG. 1B shows before growth.
Figure 1C:
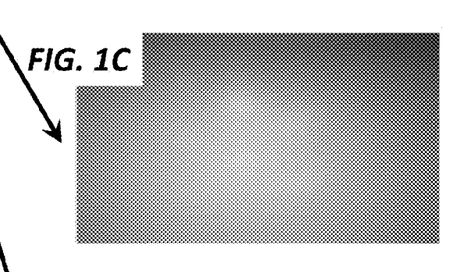
FIG. 1C after IBAD $CaF_2$ growth.
Figure 1D:
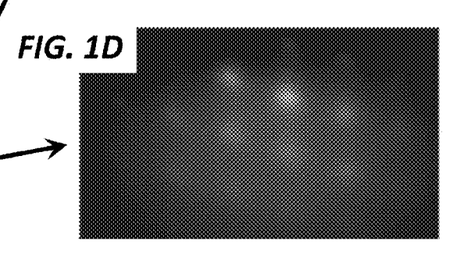
FIG. 1D after epitaxial $CaF_2$ thickening.
Figure 1E:
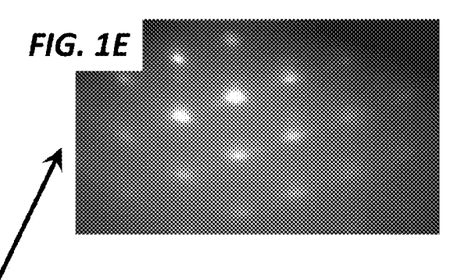
FIG. 1E after Ge epitaxy, according to one embodiment of the invention.
Figure 2:
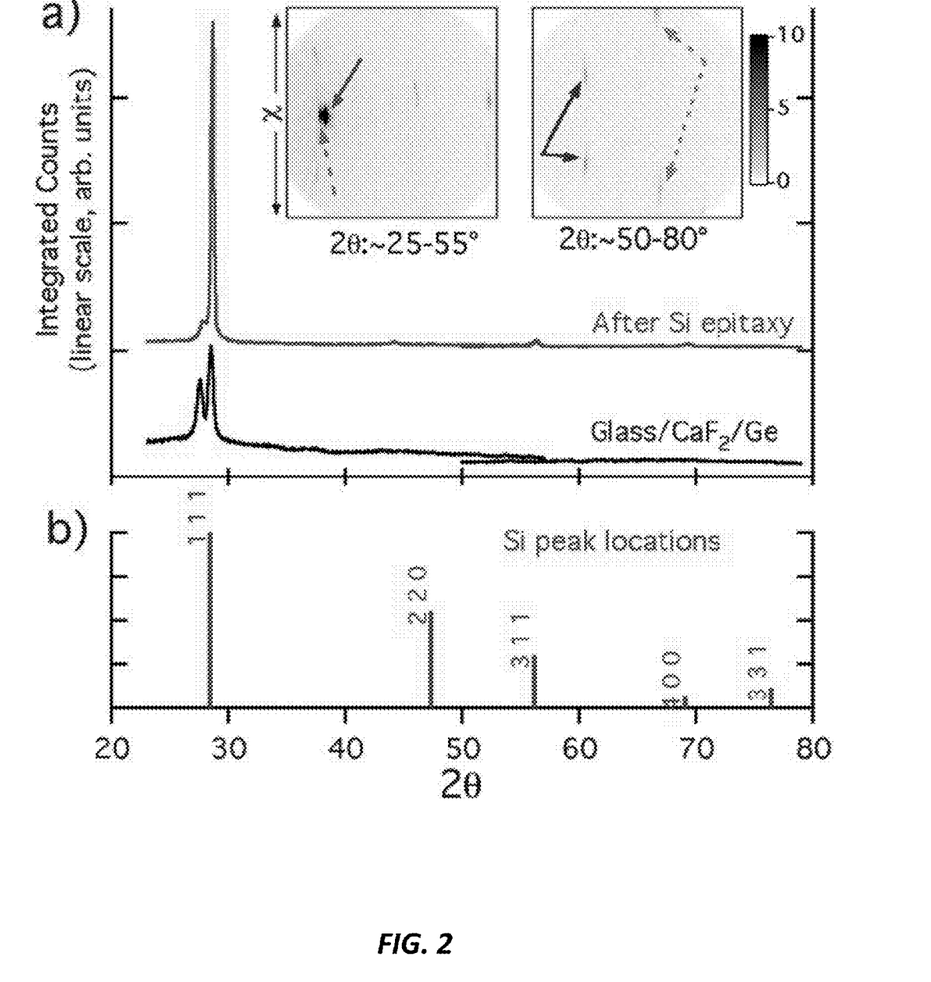
FIGS. 2A-2B show x-ray diffraction analysis of the buffer layers and stack after silicon epitaxy, according to one embodiment of the invention.

In FIGS. 1A-1E, RHEED images show the structural evolution of the $CaF_2$ and Ge layers. RHEED indicates a lack of order in the amorphous glass substrate (FIG. 1B). After 10 nm of IBAD $CaF_2$ deposition, spots in the RHEED pattern indicate cubic (111) texturing (FIG. 1C). The pattern sharpens considerably after further $CaF_2$ growth without ion-beam assist (FIG. 1D). The (111) $CaF_2$ orientation and the 54.7° ion beam angle are consistent with preferential growth of grains that have (100) faces normal to the ion beam. The ion beam preferentially sputters grains with other orientations. Further sharpening of the RHEED pattern is observed after Ge growth (FIG. 1E). The continuing improvement of the RHEED as the films grow suggests that the (111) texture develops during IBAD growth and then sharpens with subsequent epitaxial growth of additional $CaF_2$ and during heteroepitaxial growth of Ge. FIGS. 1B-1E show no evidence of secondary reflections indicative of twinning in the $CaF_2$ layer. However, secondary RHEED spots do appear abruptly after the Ge growth begins (FIG. 1E). The symmetry of the IBAD process, where channeling occurs along a single direction in the lattice, prevents twinning during seed growth and twinning is not observed during epitaxial CaF$_2$ thickening. Twinned Ge results from imperfect heteroepitaxy, possibly helping to alleviate the CaF$_2$/Ge lattice mismatch. To characterize the Si epitaxy, XRD patterns are obtained from the sample before and after silicon growth using a Bruker D2000 system with a two-dimensional detector that measures a stereographic projection of the X-rays diffracting from the sample (i.e., a range of 2θ and χ angles). To obtain the customary 2θ dependence, shown in FIG. 2A, the X-ray intensity is integrated from the raw detector from χ=−15° to χ=+15°. Before silicon growth (lower, black curve in FIG. 2A), roughly equal CaF$_2$ (2θ∼28.5°) and Ge (111) (2θ∼27.5°) peaks are observed. After silicon growth (upper, grey curve in FIG. 2A), the 28.5° peak is much larger, indicating a strong Si(111) peak. The Si and CaF$_2$ peaks are indistinguishable due to the close lattice match of the two materials. The two-dimensional (2D) XRD data acquired after Si epitaxy are shown in the inset of FIG. 2A, with the 2θ ranges indicated beneath the horizontal axes. The χ range (vertical axis) of the projection is approximately −15° to +15°. The grey-scales are set to emphasize the weak peaks away from the strong Si (111). The strongest peaks are the Ge (111) peak (dashed arrow) and combined Si and CaF$_2$ (solid arrow) peaks tightly centered near χ=0. The tight χ distributions of these peaks indicate strong out-of-plane ordering. In the high-2θ data (inset, right frame), weak Si (311) peaks at χ=±9° (solid arrows) and Si (400) peaks at χ=±12° (dashed arrows) are present. These are not the expected χ angles for a (111)-oriented silicon crystal and are likely reflections from twinned crystallites. These peaks are included in the χ-integration and result in small peaks at the Si (311) and Si (400) 2θ positions in FIG. 2A. FIGS. 2A-2B show XRD analysis of the buffer layers and stack after silicon epitaxy. In FIG. 2B, the Si powder peak locations and intensities are shown for comparison. In the inset of FIG. 2A, the detector images acquired after Si growth are shown.

Figure 3A:
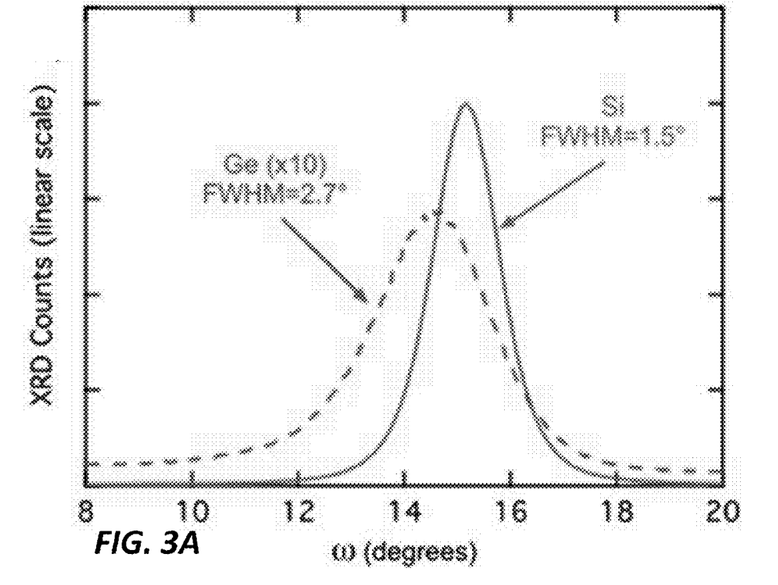
FIGS. 3A-3B show x-ray diffraction rocking curve measurements and phi-scans for the Ge(220), according to one embodiment of the invention.
Figure 3B:
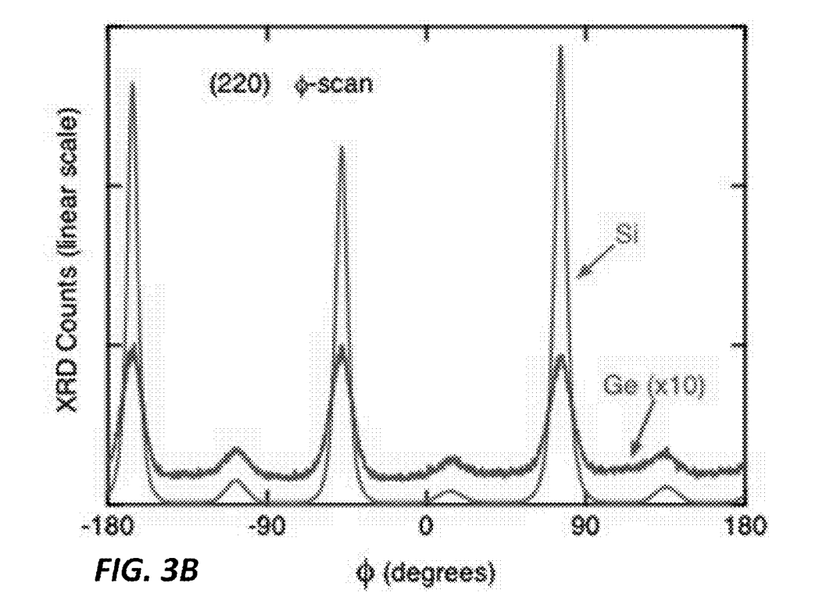

FIGS. 3A-3B show XRD rocking curve measurements and 4-scans for Ge (220). In FIG. 3A, rocking curve measurements acquired after silicon growth for the Ge (111) (dashed curve) and the Si (111) (solid curve) are shown. Full-width, half-maximum (FWHM) values of 2.7° and 1.5° for the Ge and Si peaks were measured, respectively, further confirming the out-of-plane texture. The smaller FWHM for the silicon layers suggests that texturing improves with growth. While it is possible that the Ge peak is partially broadened due to overlap of the Si and Ge peaks (see FIG. 2A), improved texture (and smaller FWHM) in thicker layers has been observed previously. During Si growth, the (111) plane has the lowest surface energy and is expected to grow more rapidly than grains oriented further from (111). As the film is thickened, therefore, the (111) grains likely "crowd out" slower growing grain orientations and improve the degree of texture. In FIG. 3B, phi-scans for the Ge (220) (dashed curve), measured at fixed ω=14.5° and 2θ=29°, and also the Si (220) (solid curve) are shown, measured at fixed ω=15.2° and 2θ=30.4°. The three strong peaks in each measurement indicate that the Ge and Si layers are biaxially textured and aligned 'cube-on-cube.' The three weaker peaks arise from twinning that is present in the Ge layer and are propagated into the epitaxial Si. The aligned, biaxial textures in the Ge and Si layers confirm epitaxial growth on the biaxially-textured CaF$_2$ seed layer.

Figure 4:
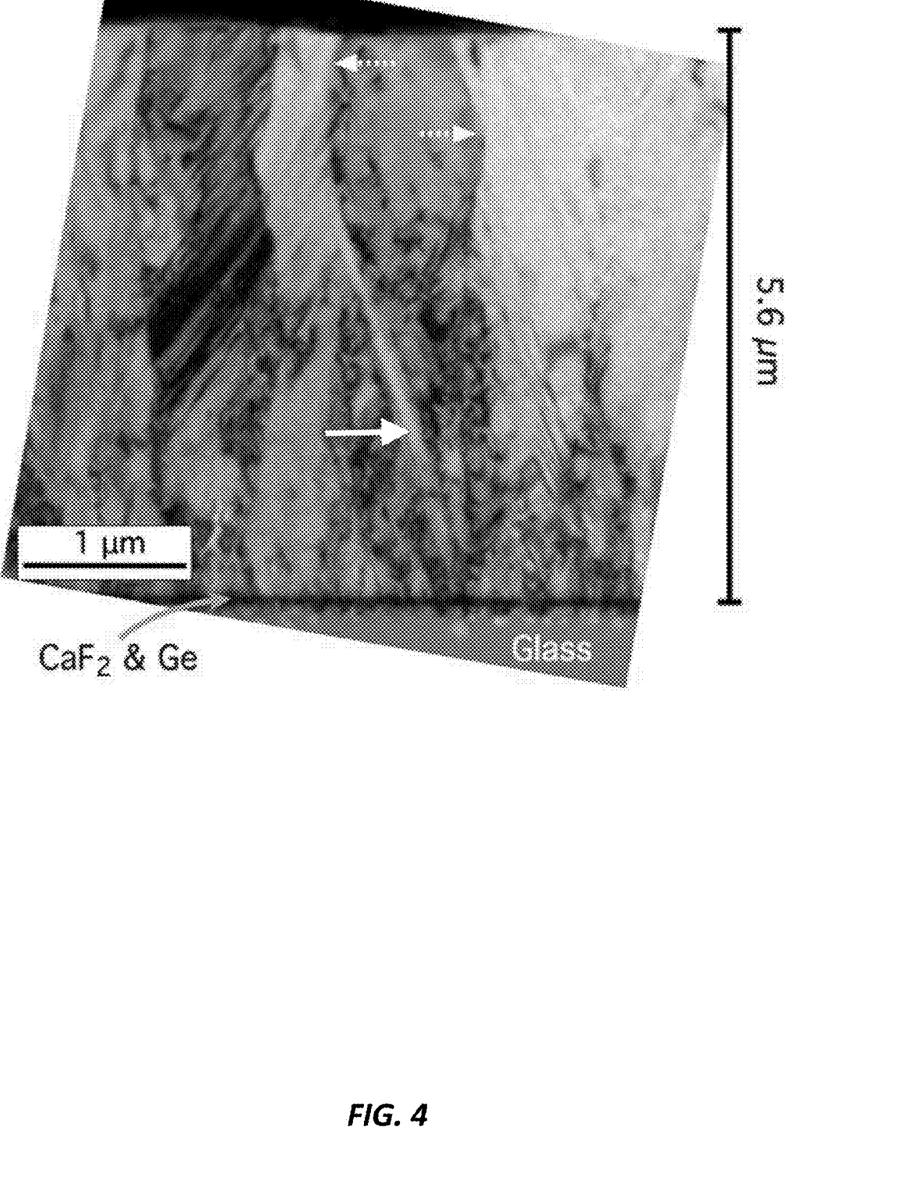
FIG. 4 shows a TEM cross-section of the sample that reveals a columnar grain structure with grain widths of ~0.5 mm, according to one embodiment of the invention.

FIG. 4 shows a TEM cross-section of the sample that reveals a columnar grain structure with grain widths of ∼0.5 mm. Two selected GBs are indicated by dashed white arrows. The interior of the silicon grains shows high dislocation densities, particularly near the Ge/Si interface. The dislocation density likely decreases with thickness, as the dislocations glide and annihilate. Further, there are numerous twins, consistent with the secondary set of weaker XRD peaks (FIGS. 2A-2B and FIG. 3) discussed above; a selected twin is indicated by the solid, white arrow.

Figure 5A:
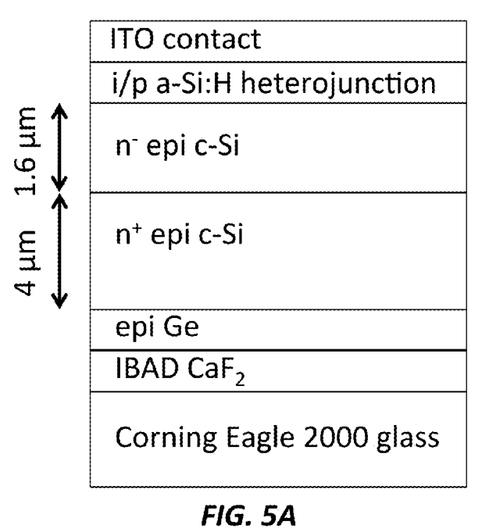
FIGS. 5A-5C show a schematic of one embodiment of a solar cell and current-voltage and quantum efficiency analysis, and other useful devices having the oriented $CaF_2$ crystalline layer, according to the current invention.
Figure 5B:
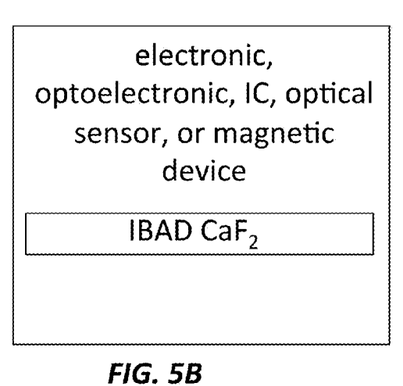
Figure 5C:
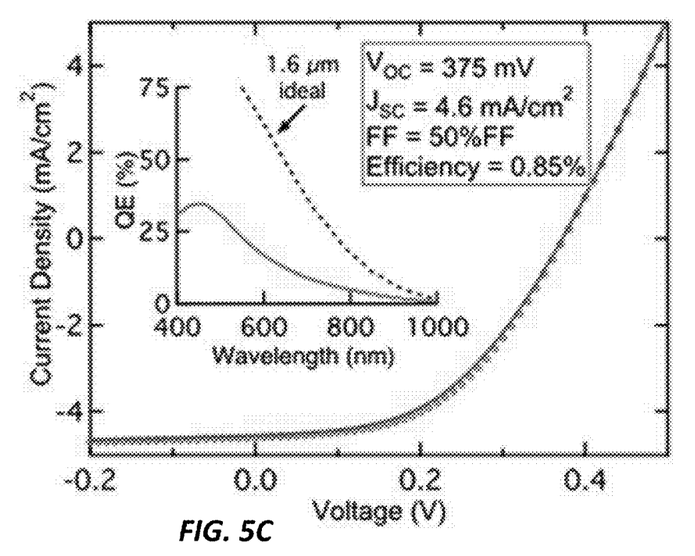

FIG. 5A shows a schematic of one embodiment of a solar cell together with current-voltage and quantum efficiency analysis shown in FIG. 5C. In this example, the silicon solar cell on CaF$_2$ seed layers is operational but the V$_{OC}$ is about 375 mV, significantly lower than comparable devices grown on electronically dead silicon wafer templates. To better understand the J-V measurement (dotted line in FIG. 5C), an equivalent solar cell model was generated (solid line). This modeling indicates that there is a large series resistance of ∼17 Ω-cm$^2$. The high resistance likely arises from inadequate doping in the n$^+$ c-Si back contact layer; high series resistance reduces the device short-circuit current, fill factor and efficiency. The inset of FIG. 5C shows the device external quantum efficiency (QE) and the ideal single-pass absorption fraction (dashed line) for a 1.6 mm thick layer. The low QE compared to the ideal case indicates that L$_D$ is shorter than required for efficient collection. Likely, the numerous intragrain defects seen in TEM (FIG. 4) reduce the minority carrier lifetime and therefore L$_D$. With improved IBAD and Si epitaxy growth, it may be possible to reduce this problematic intragrain defect density. The device presented here is the first realization of a biaxially textured film c-Si solar cell on glass based on a low-cost foreign seed. Here, biaxially textured (111) silicon was grown with ∼0.5 mm grains on glass using IBAD CaF$_2$ seed layers and fabricated an initial test solar cell. The results demonstrate both the promise and challenge of using CaF$_2$ seed layers for film silicon PV. In this first solar cell, $L_D$ is inadequate. However, if the intra-grain quality can be improved and the dangling bonds at the grain boundaries can be well-passivated, it is possible L$_D$ can be increased sufficiently for film Si PV. It is understood that the biaxial texture layer of the CaF$_2$ according to the current invention, can be used in an electronic or optoelectronic device, an integrated circuit, an optical sensor, or a magnetic device (see FIG. 5B).

Further examples of biaxial texturing of inorganic photovoltaic thin films using low energy IBAD growth are provided. Here, four types of substrates were used in these examples: fused silica; silicon (100) coated with 800 nm of thermally grown SiO$_2$; single crystal yttria-stabilized zirconia (YSZ) (111) or (100); or CaF$_2$ (111) or (100) single crystals. All substrates used in these experiments were nominally 1×1 cm in size.

Depositions for these experiments were performed in a PVD high vacuum system with a typical base pressure of 7.0×10$^{-6}$ Pa (5.0×10$^{-8}$ torr) at room temperature. A four-pocket 7 cc Temescal SuperSource provided the deposit vapor flux. A two-grid collimated Kaufman ion source at an incidence angle of either 35.3°, 45° or 54.7° (corresponding to particular crystallographic directions in the CaF$_2$ crystal) relative to the substrate normal provided an Ar ion flux to the substrate. The ion current density was monitored with a separate Faraday cup. The Faraday cup was biased at −20 V to eliminate contributions from electrons to the ion current reading.

The current invention uses ion beam assisted deposition (IBAD) to control the crystallographic texture of Si so that the crystalline grains are highly oriented in both in-plane and out-of-plane directions. These highly-oriented Si films have only small-angle grain boundaries, which are less detrimental to minority carrier lifetime compared to the grain boundaries in randomly oriented conventional Si films. The resulting increase in minority carrier lifetime enables more efficient solar cells.

In one embodiment, an oriented seed layer is provided, upon which oriented Si is epitaxially grown. There are two critical steps, first producing suitable oriented seed layers using the IBAD process and second growing Si on these seed layers. In order to decouple these steps, heteroepitaxial growth of Si on bulk single crystals of the candidate seed layer materials is provided, where the seed layer comprises $CaF_2$, which also has a good lattice match with Si. (111) textured $CaF_2$ on amorphous fused silica substrates is provided. These are highly oriented films with a ~10° in-plane orientation spread. $CaF_2$ on highly oriented Ir-coated IBAD Mg0 has been provided.

In one embodiment, the seed layer comprises $CoSi_2$, which is compatible thermally with Si and has a good lattice match with Si. $CoSi_2$ films have been formed on both single crystal yttria-stabilized zirconia (YSZ) and amorphous fused silica substrates. In one aspect, growth of Si on these $CoSi_2$ films is provided.

Figure 6A:
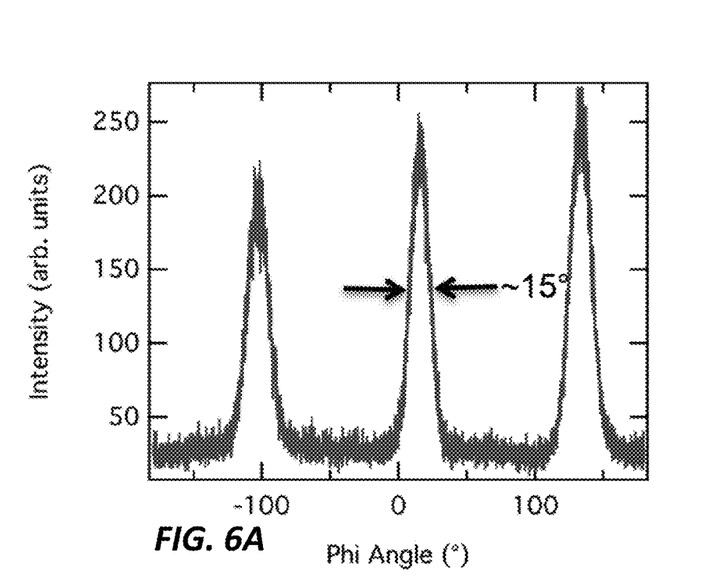
FIGS. 6A-6C show RHEED images and (220) phi scan for an IBAD $CaF_2$ film with a 30 nm homoepitaxial layer, according to one embodiment of the invention.
Figure 6B:
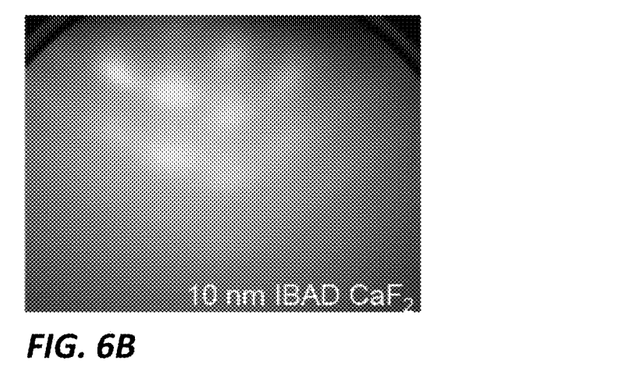
Figure 6C:
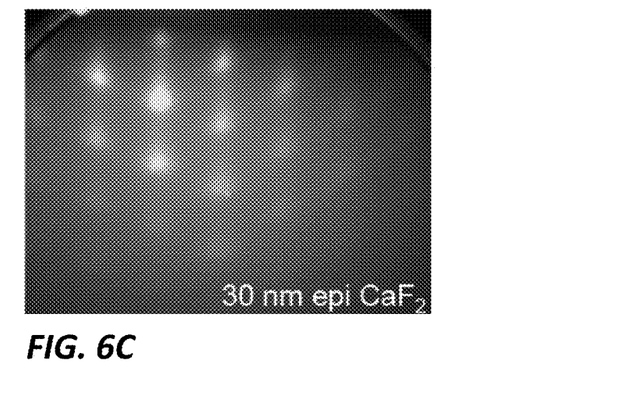

To determine if texture could be developed in $CaF_2$ by IBAD processing, $CaF_2$ IBAD films were deposited onto fused silica with a deposition rate of 0.06 nm/s and ion beam energy of 500 eV. The beam current density was ~80 $\mu A/cm^2$. FIGS. 6A-6C show RHEED images and (220) phi scan for an IBAD $CaF_2$ film with a 30 nm homoepitaxial layer. The $CaF_2$ oriented with a (111)-type texture out-of-plane in ~10 nm of deposited film as shown in the RHEED image captured at the end of the IBAD run in the upper left of FIG. 6A.

A subsequent 30 nm homoepitaxial layer of $CaF_2$ was deposited at 400° C. and its in-plane texture was measured to be ~15° FWHM for the (220) in-plane peaks as shown in FIG. 6A. The RHEED diffraction spots increased in intensity and sharpened as the epitaxial $CaF_2$ layer was added indicating that texture improved from the initial IBAD layer, as shown in FIG. 6B and FIG. 6C.

Figure 7:
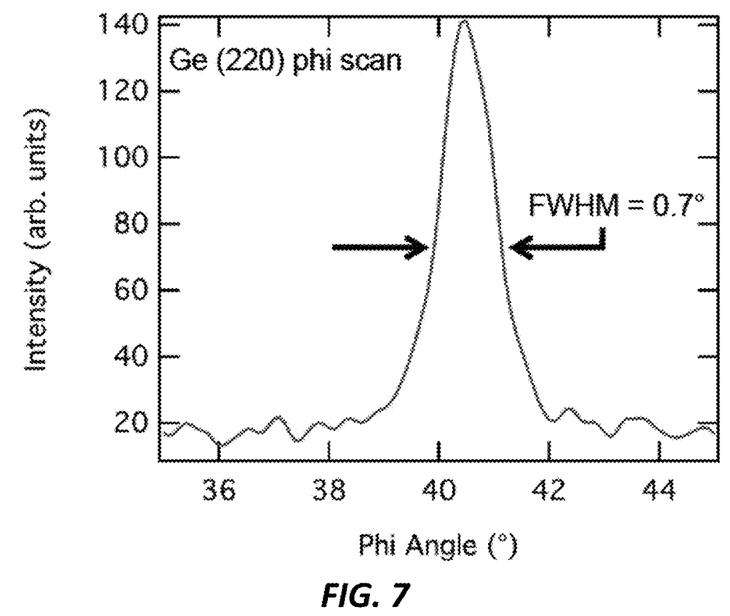
FIG. 7 shows the XRD phi-scan on the left shows the epitaxial nature of the Ge layer deposited on $CaF_2$, according to one embodiment of the invention.

In a further example of the invention, single crystal substrates of (111) and (100) $CaF_2$ were used to show $CaF_2$ is a seed layer for epitaxial growth of silicon. Little separation exists between $CaF_2$ and Si X-ray peaks and the $CaF_2$ single crystal substrate peaks were so intense that the Si peaks could not be easily distinguished using standard laboratory X-ray diffraction methods. In order to reduce this diffraction interference, yttria-stabilized zirconia (YSZ) single crystal substrates capped with thin (30 nm) layer of $CaF_2$ were used. The YSZ peaks are sufficiently removed from the Si peaks and the small x-ray diffraction signal from the thin $CaF_2$ layers will not swamp the signal from the thin Si films. The $CaF_2$ aligned well on YSZ (111) and (100) single crystal substrates, but silicon did not grow epitaxially on these capped single crystal seeds. Ge, however, did grow epitaxially on the $CaF_2$/YSZ substrates, and provided an excellent seed for subsequent growth of Si. Deposition of the Ge at 700° C. produced an epitaxial layer with good (<1° FWHM) in-plane alignment as shown in FIG. 7.

Figure 8:
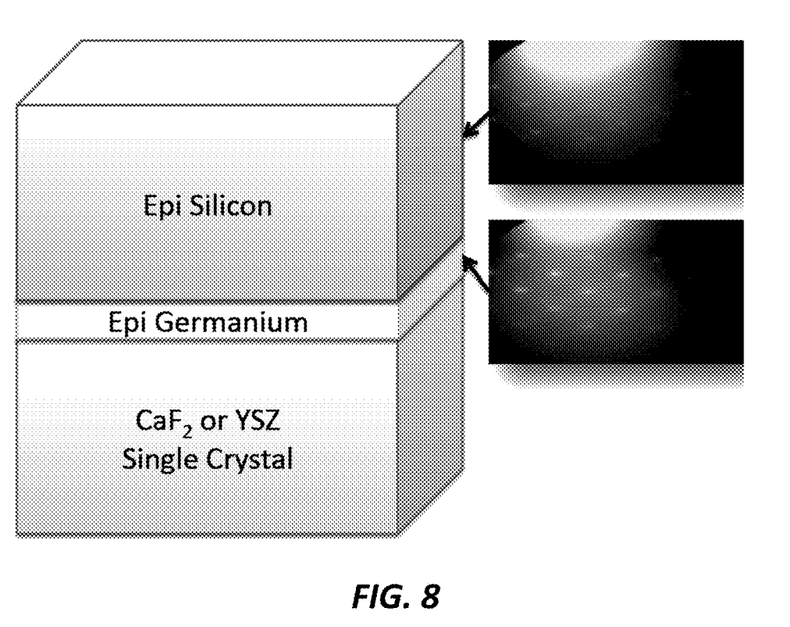
FIG. 8 shows a schematic drawing of the architecture used for demonstrating that Si can be deposited on $CaF_2$, according to one embodiment of the invention.

The subsequent deposition of Si on this Ge-buffered substrate resulted in an epitaxial film as indicated by the spot pattern for the Si in the upper RHEED image in FIG. 8. This high degree of orientation achieved indicates that growth of Si on textured $CaF_2$ proceeds with little-to-no degradation in crystallographic orientation.

Figure 9:
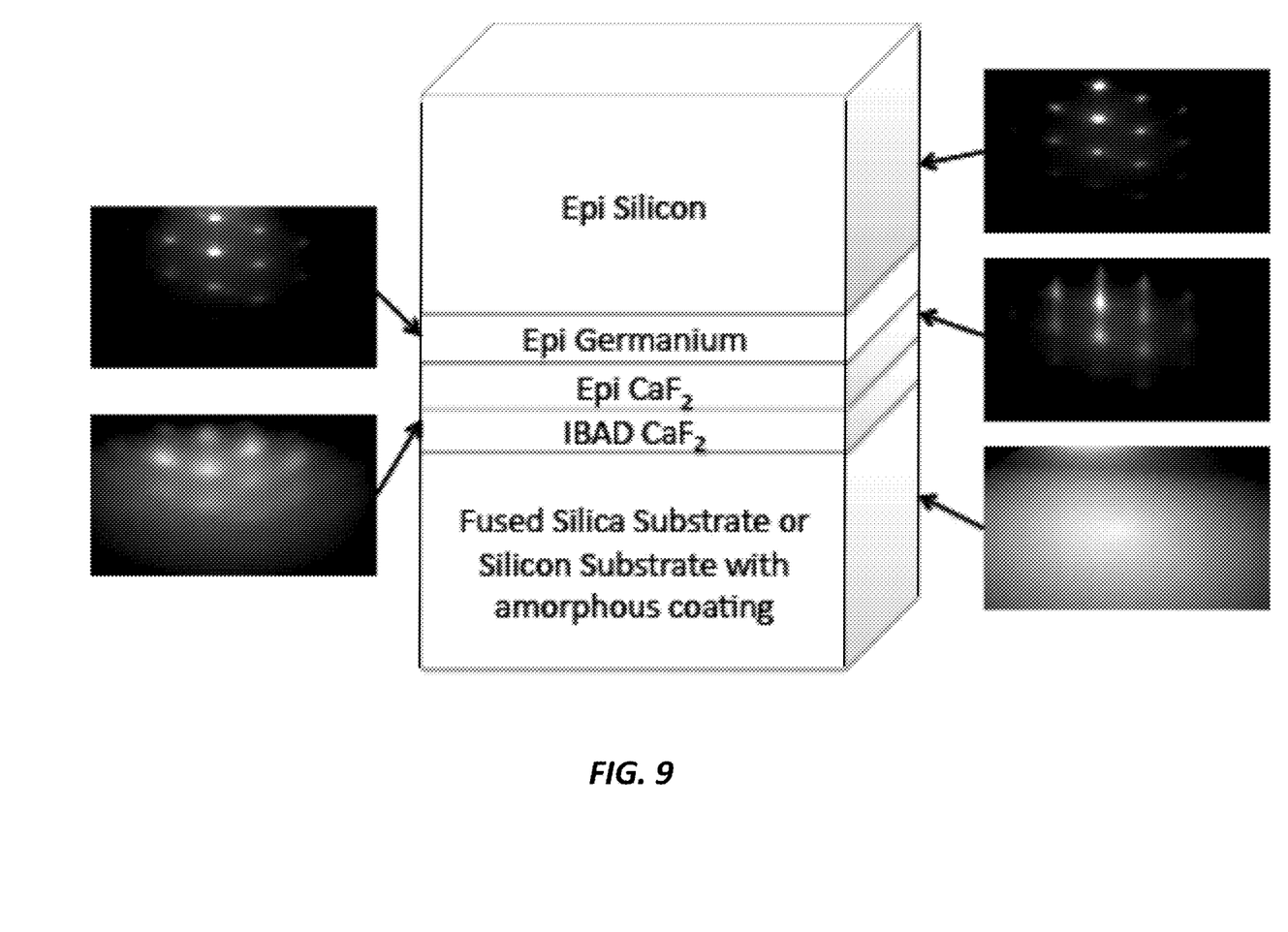
FIG. 9 shows a schematic drawing of an assembly of the IBAD $CaF_2$ film with the Ge buffer layer and silicon thin film and RHEED images taken at the conclusion of each deposition step, according to one embodiment of the invention.
Figure 10A:
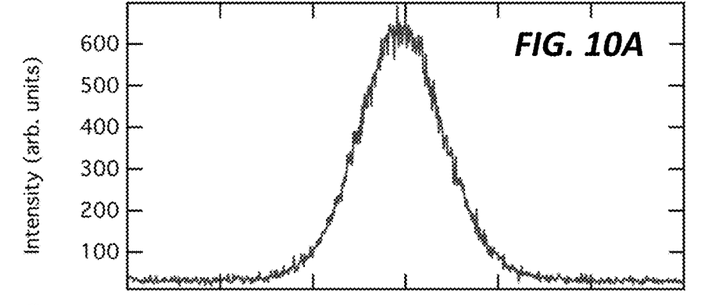
FIGS. 10A-10D show (220) peaks used to characterize the in-plane texture for both the Si and $CaF_2$ films, according to one embodiment of the invention.
Figure 10B:
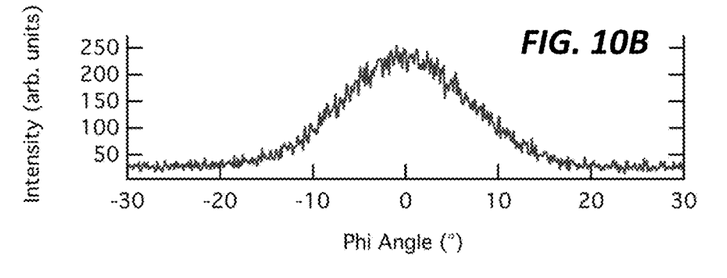
Figure 10C:
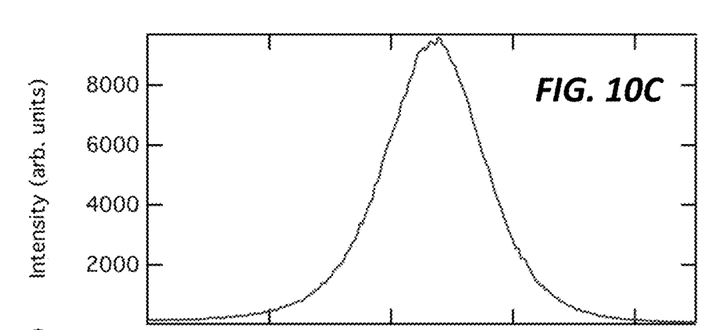
Figure 10D:
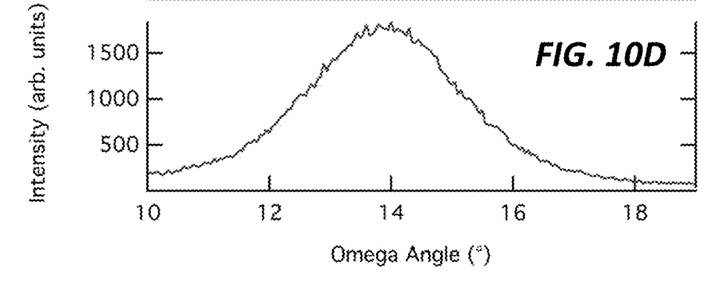

The next example shows assembly of the IBAD $CaF_2$ film with the Ge buffer layer and silicon thin film as shown FIG. 9. RHEED images taken at the conclusion of each deposition step are included in FIG. 9. The IBAD $CaF_2$ was deposited to a thickness of 10 nm at room temperature. An additional epitaxial layer of $CaF_2$ was deposited to a thickness of 100 nm at a temperature of 400° C. A 50 nm thick epitaxial Ge layer was then deposited at 560° C. The final epitaxial Si layer was deposited to a thickness of 150 nm at 560° C. Note that the starting substrate RHEED image shows only a diffuse scattering from the amorphous oxide substrate. Thus the biaxial texture in the film layers is induced by the IBAD growth process rather than any influence from the starting substrate.

The XRD analysis of the film structure described in FIG. 9 showed the presence of good in-plane alignment throughout the film structure. The (220) peaks were used to characterize the in-plane texture for both the Si and $CaF_2$ films. As shown in FIGS. 10A-10D, the $CaF_2$ (220) peak had a FWHM of 16.3° (with a 50 nm homoepitaxial $CaF_2$ layer). Deposition of the Si layer improves the texture by ~6° in-plane to a value of 10.8°, which indicates that the texture improves with each subsequent layer. This shows that the texture is improved by grain growth competition and the overgrowth of misoriented grains. Further evidence of this effect is indicated in the sharpening of the RHEED image spots shown in FIGS. 10A-10D for each additional layer.

Figure 11:
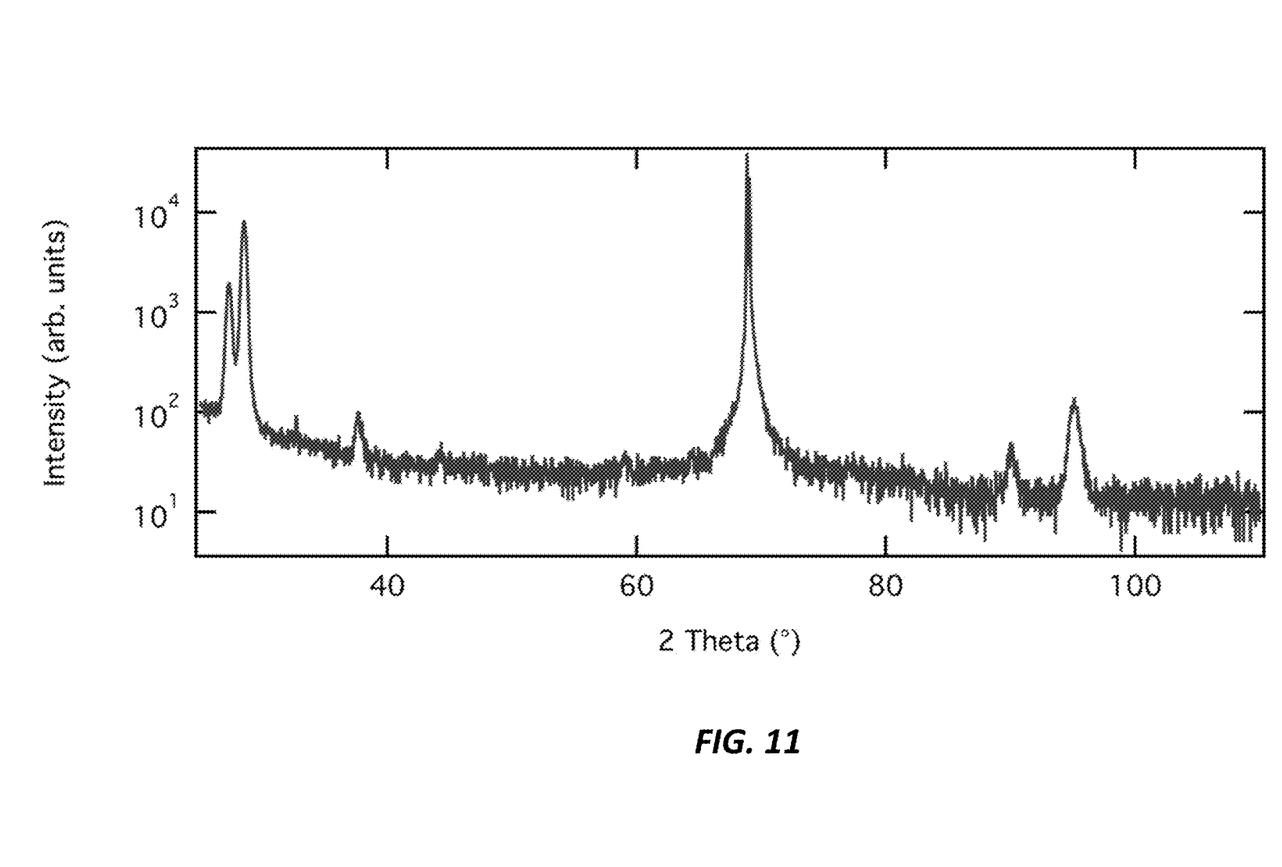
FIG. 11 show a theta-two theta XRD scan for a Si (100) wafer with native oxide/IBAD $CaF_2$/epi $CaF_2$/30 nm Ge/150 nm Si, according to one embodiment of the invention.

The films exhibit excellent out-of-plane alignment and no additional phases are detected as indicated by the theta-two theta XRD scan of FIG. 11. Only the (111) reflections are observed for the Ge and Si films. Only two additional peaks are contributed to the scan by the substrate. The Si (111) most likely includes a contribution from the $CaF_2$ IBAD and homoepitaxial layers.

Figure 12:
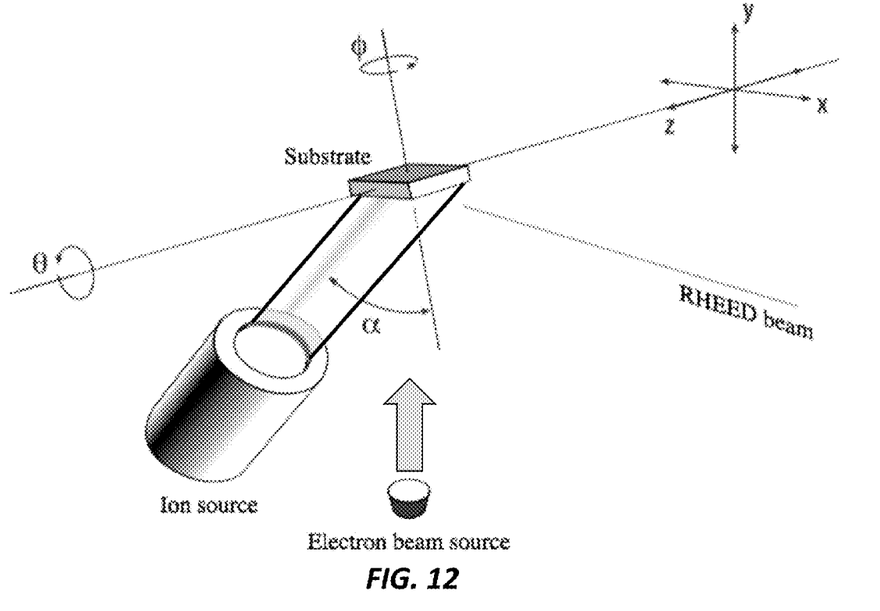
FIG. 12 shows a schematic drawing of an apparatus for depositing oriented layers, according to one embodiment of the invention.
Figure 13:
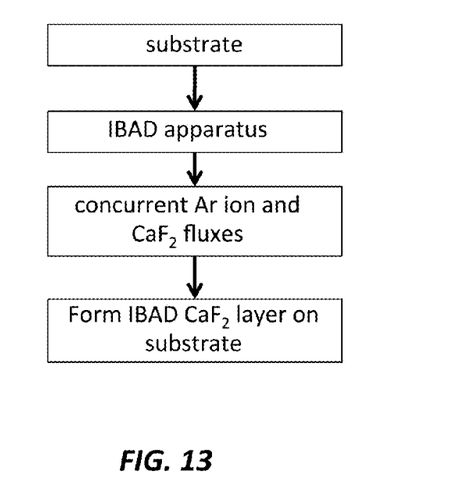
FIG. 13 shows a flow diagram of the process for forming an oriented $CaF_2$ crystalline layer on a substrate, according to one embodiment of the invention.

FIG. 12 shows a schematic drawing of an apparatus for depositing oriented layers, according to one embodiment of the invention. FIG. 13 shows a flow diagram of the process for forming an oriented $CaF_2$ crystalline layer on a substrate, according to one embodiment of the invention.

The $CaF_2$ has now been demonstrated as a suitable material for the IBAD process and useful as a template layer for subsequent silicon deposition. Even without full process optimization, $CaF_2$ films can be deposited on fused silica substrates with an in-plane texture of ~15° FWHM. Silicon can be deposited heteroepitaxially at 570° C. on a Ge buffered $CaF_2$ template with an in-plane texture of 10.8°. Additionally, an improvement in the in-plane texture of ~6° is observed as subsequent layers are deposited on the $CaF_2$ IBAD template. Further optimization of the IBAD processing conditions for $CaF_2$ is expected to improve the in-plane texture. These examples show that an IBAD template is used for polycrystalline Si deposition for photovoltaic applications.

Biaxially textured $CaF_2$ films alone can be used in many applications, for example in magnetics technologies, optical technologies, sensors, energy storage are just a few technologies which may find use for IBAD $CaF_2$.

As mentioned earlier, biaxially textured $CaF_2$ films are useful as seed layers for the subsequent epitaxial growth of a variety of materials, two of which are germanium and silicon. Many other materials can also be epitaxially deposited on $CaF_2$, many III-V semiconductor materials, for example GaAs, AlGaAs, InGaAs etc. have been successfully epitaxially grown on $CaF_2$ single crystals, and therefore can be epitaxially grown on IBAD $CaF_2$. Any material having a lattice constant close to that of $CaF_2$ are amenable to epitaxial growth on IBAD $CaF_2$. The alloyed $CaF_2$ crystalline layer can have a lattice constant in the range between 5.39 Angstroms (the approximate lattice constant of $CdF_2$) and 6.2 Angstroms (the approximate lattice constant of $BaF_2$).

It is a surprising and unexpected result that $CaF_2$ orients with IBAD in the manner described herein. For example, magnesium oxide used in the IBAD process is a material with the rocksalt crystal structure. It has been described that IBAD is used as a process to orient materials with the rocksalt structure with (100) out of plane texture. According to the current invention, $CaF_2$ does not have the rocksalt crystal structure, and it is surprising and unexpected that IBAD works with $CaF_2$, especially that $CaF_2$ orients in a (111) fashion according to the current invention.

In another aspect of the invention, the lattice constant of $CaF_2$ is ~5.45 Å, which can be modified by alloying the $CaF_2$ with other materials, particularly materials such as $BaF_2$, $SrF_2$, and $CdF_2$. These three materials are closely related to $CaF_2$ chemically and have the same crystal structure as $CaF_2$, yet have lattice constants that are different than $CaF_2$, for example ±25% difference. The lattice constant of $BaF_2$ is ~6.196 Å, $SrF_2$ is ~5.79 Å, and $CdF_2$ is ~5.39 Å. According to one embodiment of the invention, by adding some $BaF_2$ to the $CaF_2$ evaporation source, the lattice constant of the IBAD $CaF_2$ film, which is technically no longer a pure $CaF_2$ film, can be increased. By adding some $CdF_2$, the lattice constant can be decreased. This alloying effect can modify the lattice constant of $CaF_2$ films in an approximately linear fashion. In one embodiment, this alloying is achieved by having two separate deposition sources, one for $CaF_2$ and one for the alloying material. To control the stoichiometry of the film, the deposition ratio of the deposition rates is adjusted between the two sources. As more alloy material is added, the more the lattice constant changes. For example by adding 99% $BaF_2$, effectively creates biaxially textured $BaF_2$, with a small amount of $CaF_2$. In this aspect of the invention $CaF_2$ may be replaced by $BaF_2$ or $CdF_2$ or $SrF_2$, since the process would work equally as well with all three of these materials (as well as any combination of these materials), given all three materials' similarity to $CaF_2$, as stipulated above. In yet another aspect an alloyed $CaF_2$ crystalline layer has a composition that is up to 99.999% alloying material. In another aspect, the alloyed $CaF_2$ crystalline layer is doped with Europium.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. All such variations are considered to be within the scope and spirit of the present invention as defined by the following claims and their legal equivalents.

What is claimed:

1. A method of forming a biaxially textured crystalline $CaF_2$ layer, comprising:
    a. placing a substrate in a vapor flux containing calcium and fluorine, wherein said vapor flux is created by a physical vapor deposition source; and
    b. directing an ion beam on said substrate, wherein an oriented $CaF_2$ crystalline layer is formed on said substrate.

2. The method according to claim 1, wherein said oriented $CaF_2$ crystalline layer is disposed for growth of a subsequent epitaxial layer.

3. The method according to claim 2, wherein said subsequent epitaxial layer is selected from the group consisting of $CaF_2$, $BaF_2$, $CdF_2$, $SrF_2$, Si, Ge, YSZ, $Al_2O_3$, Cu, Au, Ag, Pt, Ir, GaAs, GaP, AlAs, ZnSe, CdS, InP, InAs, InGaAs AlGaAs, GaSb, CdSe, AlSb, ZnTe, and InGaAs.

4. The method according to claim 1, wherein said substrate is selected from the group consisting of glass, metal, ceramic, polymer, Si, Ge, YSZ, $Al_2O_3$, Cu, Au, Ag, Pt, Ir, GaAs, GaP, AlAs, ZnSe, CdS, InAs, InGaAs AlGaAs, GaSb, CdSe, AlSb, ZnTe, InGaAs, InP, fused quartz, $SiO_2$, SiN, glass, plastics, and metal foils.

5. The method according to claim 1, wherein said oriented $CaF_2$ crystalline layer contains added materials to form an alloyed $CaF_2$ crystalline layer.

6. The method according to claim 5, wherein said added materials are selected from the group consisting of $BaF_2$, $SrF_2$, and $CdF_2$.

7. The method according to claim 5, wherein said alloyed $CaF_2$ crystalline layer comprises a lattice constant in the range between 5.39 Angstroms and 6.2 Angstroms.

8. The method according to claim 5, wherein said alloyed $CaF_2$ crystalline layer has a composition that is up to 99.999% alloying material.

9. The method according to claim 1, wherein said oriented $CaF_2$ crystalline layer is doped with Europium.

\* \* \* \* \*